(12) United States Patent
Tanaka et al.

(10) Patent No.: US 7,618,494 B2
(45) Date of Patent: Nov. 17, 2009

(54) SUBSTRATE HOLDING STRUCTURE AND SUBSTRATE PROCESSING DEVICE

(75) Inventors: Sumi Tanaka, Nirasaki (JP); Tetsuya Saito, Nirasaki (JP); Masuhiro Natsuhara, Itami (JP); Hirohiko Nakata, Itami (JP)

(73) Assignees: Tokyo Electron Limited, Tokyo-to (JP); Sumitomo Electric Industries, Ltd., Osaka-Fu (JP)

( * ) Notice: Subject to any disclaimer, the term of this patent is extended or adjusted under 35 U.S.C. 154(b) by 0 days.

(21) Appl. No.: 10/568,683

(22) PCT Filed: Aug. 18, 2004

(86) PCT No.: PCT/JP2004/011836
§ 371 (c)(1),
(2), (4) Date: Feb. 17, 2006

(87) PCT Pub. No.: WO2005/017984
PCT Pub. Date: Feb. 24, 2005

(65) Prior Publication Data
US 2006/0191639 A1    Aug. 31, 2006

(30) Foreign Application Priority Data
Aug. 18, 2003   (JP) .............................. 2003-294425

(51) Int. Cl.
*H01L 21/00* (2006.01)
*C23C 16/00* (2006.01)
*C23C 14/00* (2006.01)

(52) U.S. Cl. ...................... 118/725; 118/728; 118/724; 156/345.52

(58) Field of Classification Search ........... 118/715–33, 118/725, 728, 724; 156/345.1–55, 345.51, 156/345.52
See application file for complete search history.

(56) References Cited

U.S. PATENT DOCUMENTS 6,215,643 B1 * 4/2001 Nagasaki .................... 361/234

(Continued)

FOREIGN PATENT DOCUMENTS

JP    11-354526    12/1999

(Continued)

OTHER PUBLICATIONS

Notification of Transmittal of Copies of Translation of the International Preliminary Report on Patentability (Form PCT/IB/338)—PCT/JP2004/011836, dated Jan. 2004.

(Continued)

*Primary Examiner*—Ram N. Kackar
(74) *Attorney, Agent, or Firm*—Smith, Gambrell & Russell, LLP

(57) ABSTRACT

The object of the present invention is to prevent damage due to thermal stress induced into a substrate holding table in a substrate holding structure for holding a substrate to be processed. In the substrate holding structure having the substrate holding table arranged at the top of a support column, a flanged part is defined by an inner circumferential surface and an outer circumferential surface at a joint between the support column and the substrate holding table. The inner circumferential surface is formed of an inclined surface, which is inclined such that the inner diameter of the flanged part successively increases as approaching the lower surface of the substrate holding table. On the lower surface of the substrate holding table to which the flanged part is joined, a U-shaped groove is formed so as to correspond to the outer circumferential surface of the flanged part.

9 Claims, 8 Drawing Sheets

U.S. PATENT DOCUMENTS

| | | | |
|---|---|---|---|
| 7,241,346 B2 * | 7/2007 | Hanamachi et al. | ......... 118/725 |
| 2002/0170679 A1 | 11/2002 | Yamaguchi et al. | |
| 2003/0183341 A1 * | 10/2003 | Yamaguchi et al. | .... 156/345.52 |

FOREIGN PATENT DOCUMENTS

| | | |
|---|---|---|
| JP | 2000-21957 | 1/2000 |
| JP | 2002-373837 | 12/2002 |
| JP | 2003-60017 | 2/2003 |
| JP | 2003-224044 | 8/2003 |
| JP | 2003224044 A * | 8/2003 |
| JP | 2004022382 A * | 1/2004 |

OTHER PUBLICATIONS

PCT International Preliminary Report on Patentability (Form PCT/IB/373)—PCT/JP2004/011836, dated Jan. 2004.

Translation of PCT Written Opinion of the International Searching Authority (PCT/ISA/237) dated Jan. 2004.

* cited by examiner

SUBSTRATE HOLDING STRUCTURE AND SUBSTRATE PROCESSING DEVICE

TECHNICAL FIELD

The present invention relates to a substrate holding structure used for holding a substrate to be processed in a substrate processing apparatus and a substrate processing apparatus utilizing the substrate holding structure.

BACKGORUND ART

In a substrate processing apparatus, such as a CVD apparatus, a plasma-assisted CVD apparatus and an etching apparatus, a substrate holding structure is arranged in a processing vessel to hold a substrate to be processed. Such a substrate holding structure includes a substrate holding table for holding the substrate to be processed and a support column for supporting the substrate holding table. A heating mechanism is arranged in the substrate holding table to heat the substrate at a predetermined temperature.

In CVD apparatuses including plasma-assisted CVD apparatuses and heat treatment apparatuses, a substrate must be heated at a temperature of 400° C. or more, in some cases, 600° C. or more. With such a heating, a great temperature gradient is generated across the substrate holding table.

The substrate holding table is generally made of a ceramic material, such as AlN, having excellent corrosion resistance. If thermal stress is induced into the substrate holding table due to the temperature gradient, the substrate holding table may possibly be damaged.

A structure for solving the above problem is disclosed in JP2002-373837A. FIG. 1 schematically shows the overall structure of a substrate holding structure shown in JP2002-37383A. FIG. 2 schematically shows the vicinity of a joint between a substrate holding table and a support column in the substrate holding structure.

Referring to FIG. 1, the substrate holding table 10 is held on the support column 11. The support column 11 is provided with a flanged part 11A at the joint to the holding table 10. Referring to FIG. 2, the support column 11 is provided with a curved surface 11B at a transition part from a main part of the support column 11 to the flanged part 11A to reduce thermal stress concentration at the transition part. On the flanged part 11A side of the substrate holding table 10, the substrate holding table 10 is provided with a thick joint part 10A, which is defined by a curved surface 10B whose profile undergoes continuous transition to the profile of the flanged part 11A.

According to the arrangement of FIGS. 1 and 2, as the parts of substrate holding table 10 other than the thick joint part 10A is thinner, an amount of heat transferred in the substrate holding table 10 is reduced. In addition, as the side surface of the thick joint part 10A is formed of a curved surface that undergoes continuous transition to the side surface of the flanged part 11A, thermal stress concentration at the joint is prevented.

Note that there exist other prior-art documents relating to this technical field, JP2000-169268A, JP2000-290773A, JP2002-184844A, JP5-101871A and JP7-230876A.

In the aforementioned substrate holding structure disclosed in JP2002-37383A, it is necessary to grind the whole area of the back surface of the substrate holding table 10 other than the thick joint part 10A. However, as the substrate holding table 10 is made of a ceramic material which is difficult to grind, such as AlN, the grinding of such a large area greatly increases the manufacturing cost of the substrate holding structure.

On the contrary, if the substrate holding table 10 is not ground in the above manner, thermal stress due to temperature gradient induced in the substrate holding table 10 is concentrated on the boundary between the flanged part 11A and the substrate holding table 10, resulting in damage of the substrate holding table 10.

DISCLOSURE OF THE INVENTION

An object of the present invention is to provide a substrate holding structure, which can be made at a low manufacturing cost and which can suppress thermal stress concentration, and also provide a substrate processing apparatus employing such a substrate holding structure.

Another object of the present invention is to reduce temperature gradient in a substrate holding table.

In order to attain the above objects, the present invention provides a substrate holding structure, which includes a support column provided at a top end portion thereof with a flanged part, and a substrate holding table joined to the flanged part, wherein: the substrate holding table includes a heating mechanism; the substrate holding table is provided in a lower surface thereof with a U-shaped groove extending along an outer circumferential surface of the flanged part; and an inner circumferential surface of the U-shaped groove is connected to the outer circumferential surface of the flanged parts to form a continuous single plane.

In one preferred embodiment, in sectional view, both an end portion of a profile line of the inner circumferential surface of the U-shaped groove on a side of the flanged part and a profile line of the outer circumferential surface of the flanged part are situated on a single line segment extending in a vertical direction.

In one preferred embodiment, the substrate holding structure is made by joining the flanged part and the substrate holding table to each other after forming them individually; and a joint surface between the flanged part and the substrate holding table is positioned within a range corresponding to the single line segment extending in the vertical direction.

In one preferred embodiment, an inner circumferential surface of the flanged part provides an inclined surface, which is inclined such that an inner diameter of the flanged part successively increases as approaching the lower surface of the substrate holding table.

In one preferred embodiment, a recess is formed in a part of a portion, opposing the flanged part, of the lower surface of the substrate holding table; and the flanged part is joined to the lower surface of the substrate holding table only at an outermost annular area thereof.

In one preferred embodiment, the heating mechanism includes an inner heating-mechanism part and an outer heating-mechanism part formed outside the inner heating-mechanism part; and the inner heating-mechanism part and the outer heating-mechanism part are driven by first and second drive power supply system both extending in the support column, respectively.

In this case, preferably, the substrate holding table includes first and second semicircular conductive patterns, which are arranged below the heating mechanism and are connected to first and second power supply lines constituting the second drive power supply system, respectively; and the first and second conductive patterns substantially cover a whole area of the substrate holding table except for gap areas defined between the first conductive pattern and the second conductive pattern.

The present invention further provides a substrate holding structure including a support column provided at a top end portion thereof with a flanged part, and a substrate holding table joined to the flanged part, wherein: the substrate holding table includes a heating mechanism; the support column includes, at a joint between the support column and the substrate holding table, a flanged part having an inner circumferential surface and an outer circumferential surface; the inner circumferential surface provides an inclined surface, which is inclined such that an inner diameter of the flanged part successively increases as approaching the lower surface of the substrate holding table; the outer circumferential surface provides an inclined surface, which is inclined such that an outer diameter of the flanged part successively increases as approaching the lower surface of the substrate holding table; and the inclined surface constituting the outer circumferential surface undergoes continuous transition to the lower surface of the substrate holding table.

In one preferred embodiment, the lower surface of the substrate holding table is formed in a flat surface at a part joined to the flanged part and an area surrounding the part.

The present invention further provides a substrate processing apparatus, which includes: a processing vessel connected to an exhaust system; a gas supply system that supplies a process gas into the processing vessel; and the aforementioned substrate holding structure arranged in the processing vessel.

BEST MODE FOR CARRYING OUT THE INVENTION

1st. EMBODIMENT

Figure 3:
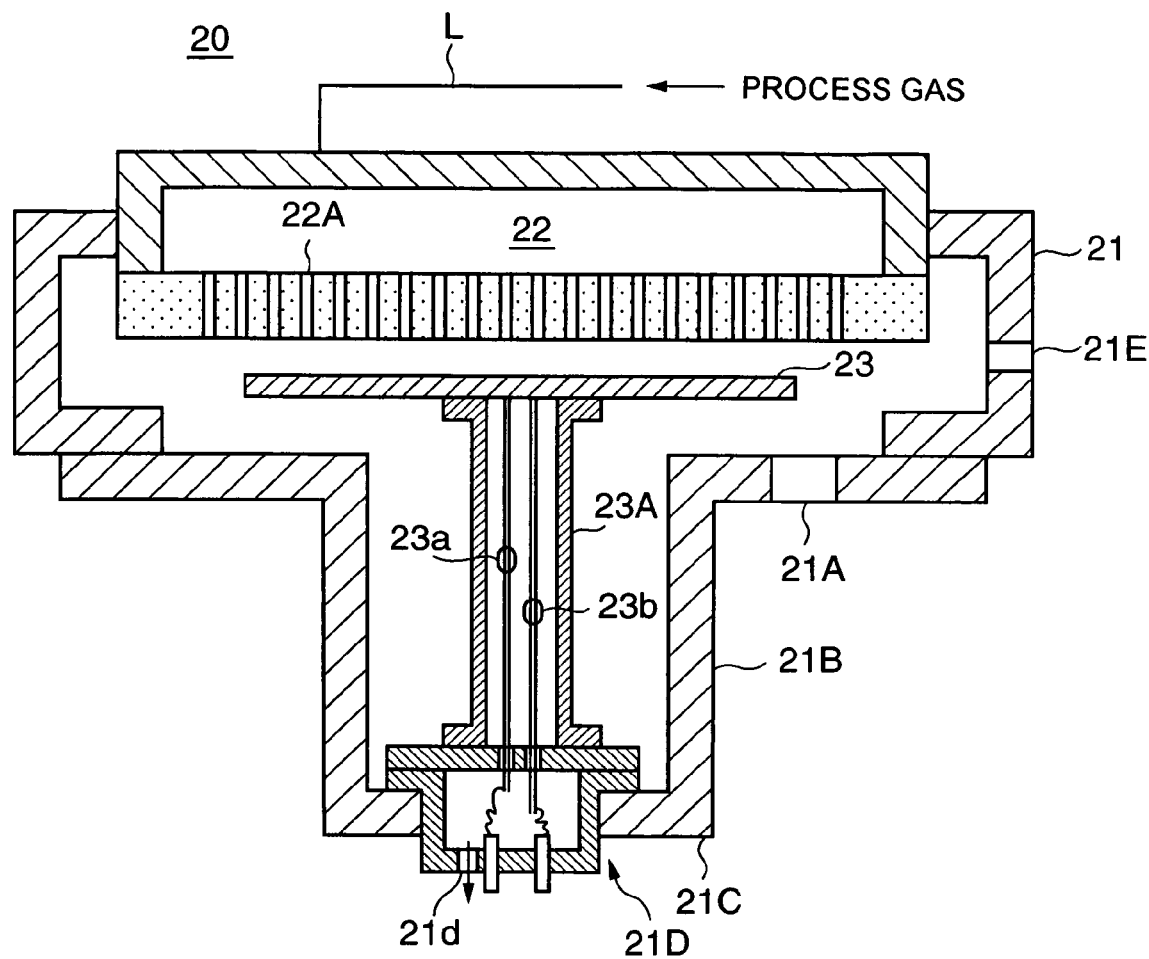
FIG. 3 is a vertical cross-sectional view schematically showing the constitution of a substrate processing apparatus in a first embodiment of the present invention.

FIG. 3 shows the constitution of a substrate processing apparatus 20 in the first embodiment of the present invention, while FIGS. 4 to 7 show the constitution of a substrate holding structure 50 employed in the substrate processing apparatus 20 of FIG. 3.

Referring to FIG. 3, the substrate processing apparatus 20 includes a processing vessel 21 connected to an exhaust system (not shown) through an exhaust port 21A. A shower head 22 is arranged at the top of the processing vessel 21 to discharge a process gas, which is supplied from an external gas source (not shown) through a line L, into a processing space in the processing vessel 22 through a number of openings 22A. A substrate holding table 23 for holding a substrate to be processed (not shown) is disposed in the processing vessel 21 so as to oppose the shower head 22.

The substrate holding table 23 is made of a ceramic material, such as AlN, having excellent corrosion resistance, high heat conductivity, high resistivity and excellent thermal-shock resistance. The substrate holding table 23 is supported on a support column 23A made of a ceramic material, such as AlN, which is the same as the material of the substrate holding table 23. Joining of these ceramic components 23, 23A is preferably accomplished by solid-state welding, but may be accomplished by solid-liquid welding or soldering. An extension part 21B extending downward from a bottom part of the processing vessel 21. The support column 23A extends through the extension part 21B, and is fixed to an end part 21C of the extension part 21B. Power supply lines 23a and 23b extend through the support column 23A for driving a heating mechanism (heater) embedded in the substrate holding table 23. The power supply lines 23a and 23b are drawn out through a terminal chamber 21D, which is provided at the end part 21C for inhibiting oxidation or corrosion of the power supply lines. The terminal chamber 21D is provided with an exhaust port 21d for exhausting the interior of the support column 23A.

An opening 21E for loading and unloading of a substrate to be processed is formed in the processing vessel 21D at a level corresponding to the substrate holding table 23. The substrate holding table 23 is provided with lifter pins (not shown) to lift up a substrate after being processed.

The substrate holding table 23 of FIG. 3 is provided with a structure for reducing thermal stress, which will be described later. However, for simplicity of drawings, FIGS. 3 and 4 to 6 do not illustrate that structure.

Figure 4:
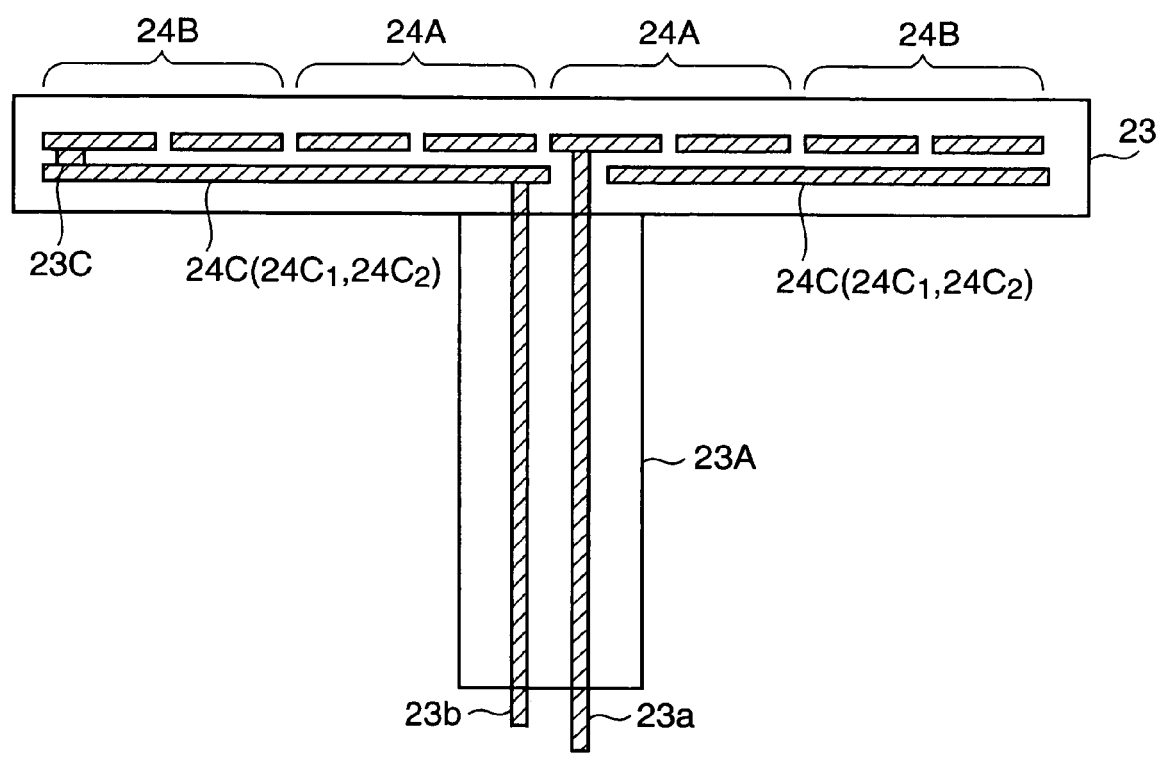
FIG. 4 is a vertical cross-sectional view schematically showing the constitution of a substrate holding structure employed in the substrate processing apparatus of FIG. 3.
Figure 5:
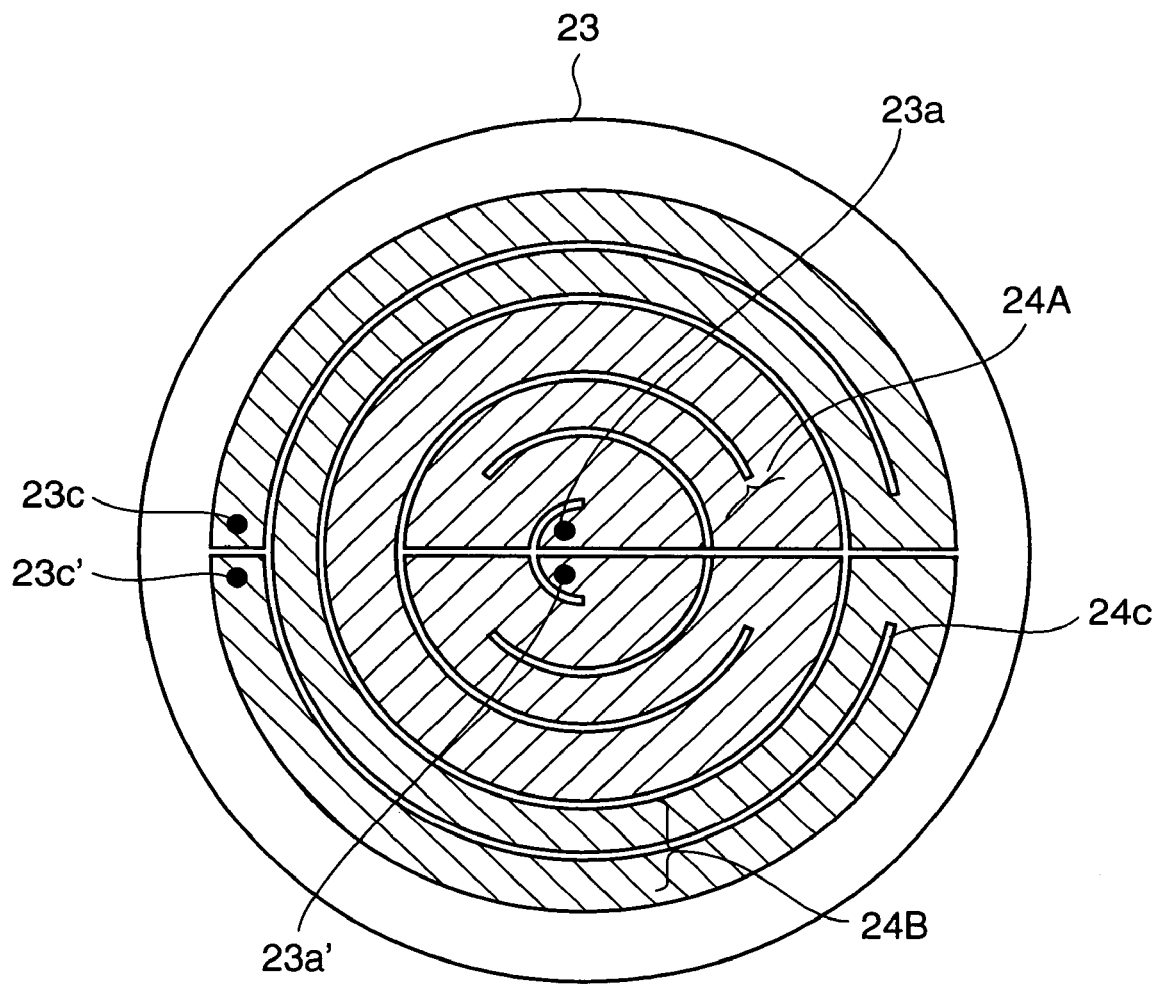
FIG. 5 is a plan view showing a heater pattern of a heating mechanism employed in the substrate holding structure of FIG. 4.
Figure 6:
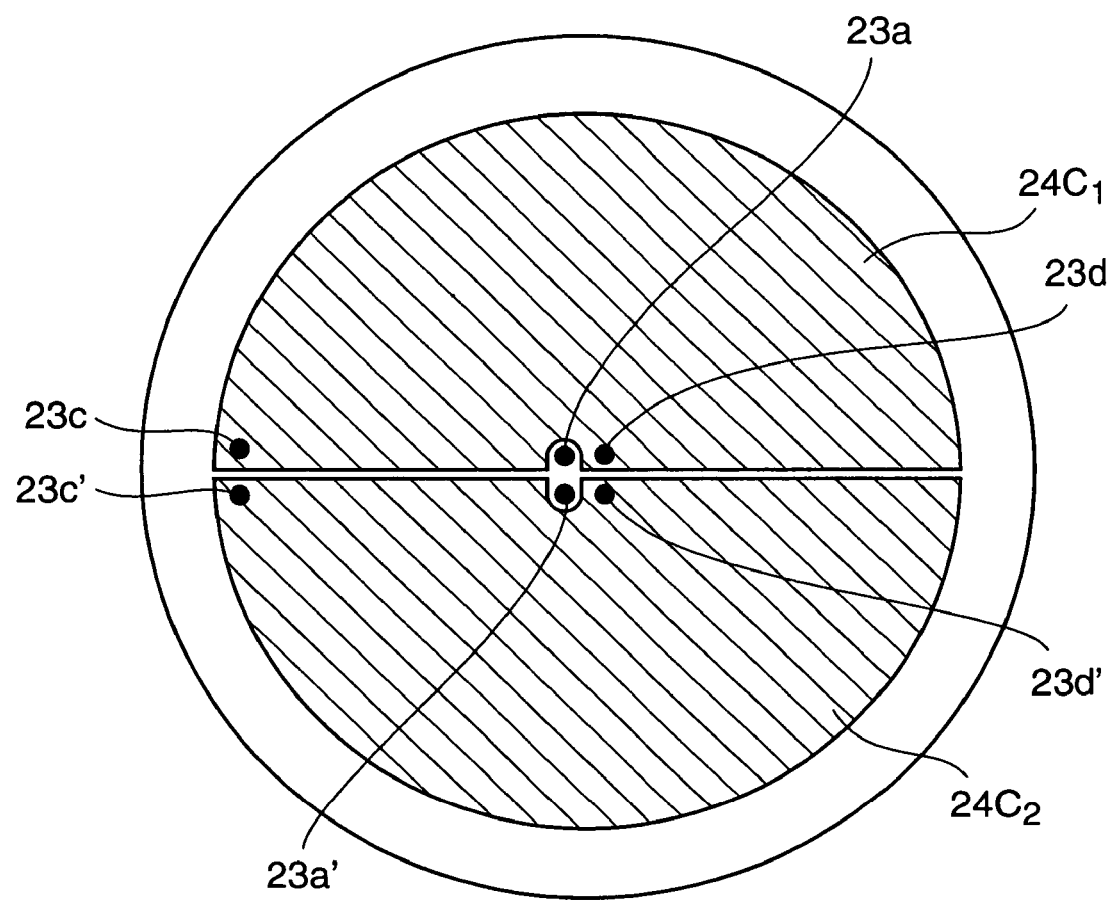
FIG. 6 is a plan view showing a power feeding pattern of the heating mechanism employed in the substrate holding structure of FIG. 4.

FIGS. 4 to 6 show the heating mechanism embedded in the substrate holding table 23. Referring to FIG. 4, the heating mechanism includes an inner heater pattern 24A formed in the vicinity of the center of the substrate holding table 23 and an outer heater pattern 24B formed outside the inner heater pattern 24A. The inner heater pattern 24A is supplied with electric power through the power supply line 23a. The outer heater pattern 24B is supplied with electric power through the power supply line 23b and a power supply pattern 24C formed below the heater patterns 24A and 24B.

FIG. 5 shows a planar arrangement of the heater patterns 24A and 24B. In FIG. 5, the heater patterns 24A and 24B are indicated by hatching. The heater patterns 24A and 24B are made of a heat-resistant metal having a thermal expansion coefficient generally equal to that of AlN forming the substrate holding table 23, for instance, W or Mo. The heater patterns 24A and 24B can be formed by forming a film of the heat-resistant metal on the substrate holding table 23 uniformly, and subsequently patterning cutouts 24c in the film. Alternatively, the heater patterns 24A, 24B may be formed by forming grooves of a predetermined pattern on the substrate holding table 23, and successively embedding the heat-resistant metal in the grooves. The heater pattern 24A is connected to one of power-supply wires of the power supply line 23a at a connecting part 23a in a central part of the substrate holding table 23, and is connected to the other of the power-supply wires of the power supply line 23a at a connecting part 23a' in the central part of the substrate holding table 23. The heater pattern 24B is connected to a power-supply pattern $24C_1$ connected to one of power-supply wires of the power supply line 23b at a connecting part 23c, and is connected to a power-supply pattern $24C_2$ connected to the other of power-supply wires of the power supply line 23b at a connecting part 23c'.

Note that the profiles of the heater patterns 24A and 24B are not limited to those shown in the drawings. As long as the calorific value distribution in each heater pattern is narrow, another profile, such as a spiral, of the heater patterns 24A and 24B is possible. The heating elements are not limited to plate-shaped or film-shaped as illustrated, and may be formed of coiled resistant-heating wires.

FIG. 6 shows a planar arrangement of the power supply patterns $24C_1$ and $24C_2$. In FIG. 6, the power supply patterns $24C_1$ and $24C_2$ are indicated by hatching. As shown herein, the power supply patterns $24C_1$ and $24C_2$ comprise semicircular conductive films. The power supply patterns $24C_1$ and $24C_2$ can be made of the same material and the same manufacturing process as those of the heater patterns 24A and 24B. The power supply patterns $24C_1$ and $24C_2$ may be in a form of a plate, a film or a mesh. The power supply pattern $24C_1$ is connected to one of the power supply wires of the power supply line 23b at a connecting part 23d, while the power supply pattern $24C_2$ is connected to the other of the power-supply wires of the power supply line 23b at a connecting part 23d'.

In this way, with the substrate holding table 23 of this embodiment, as the inner heater pattern 24A and the outer heater pattern 24B are respectively supplied with electric power independently, it is possible to minimize temperature gradient in the substrate holding table 23, reducing the possibility of damage, such as cracking, due to the temperature gradient. In addition, as the temperature of the inner area and the outer area of the substrate holding table 23 can be controlled independently, process uniformity in processing a substrate is improved. Note that when supplying the heater patterns 24A and 24B with electric power, the power supply patterns $24C_1$ and $24C_2$ are also heated up. Nevertheless, since the power supply patterns $24C_1$ and $24C_2$ are arranged generally over the whole area of the substrate holding table 23, the temperature gradient in the substrate holding table 23 derived from the heating of the power supply patterns $24C_1$ and $24C_2$ is minimized.

Figure 7:
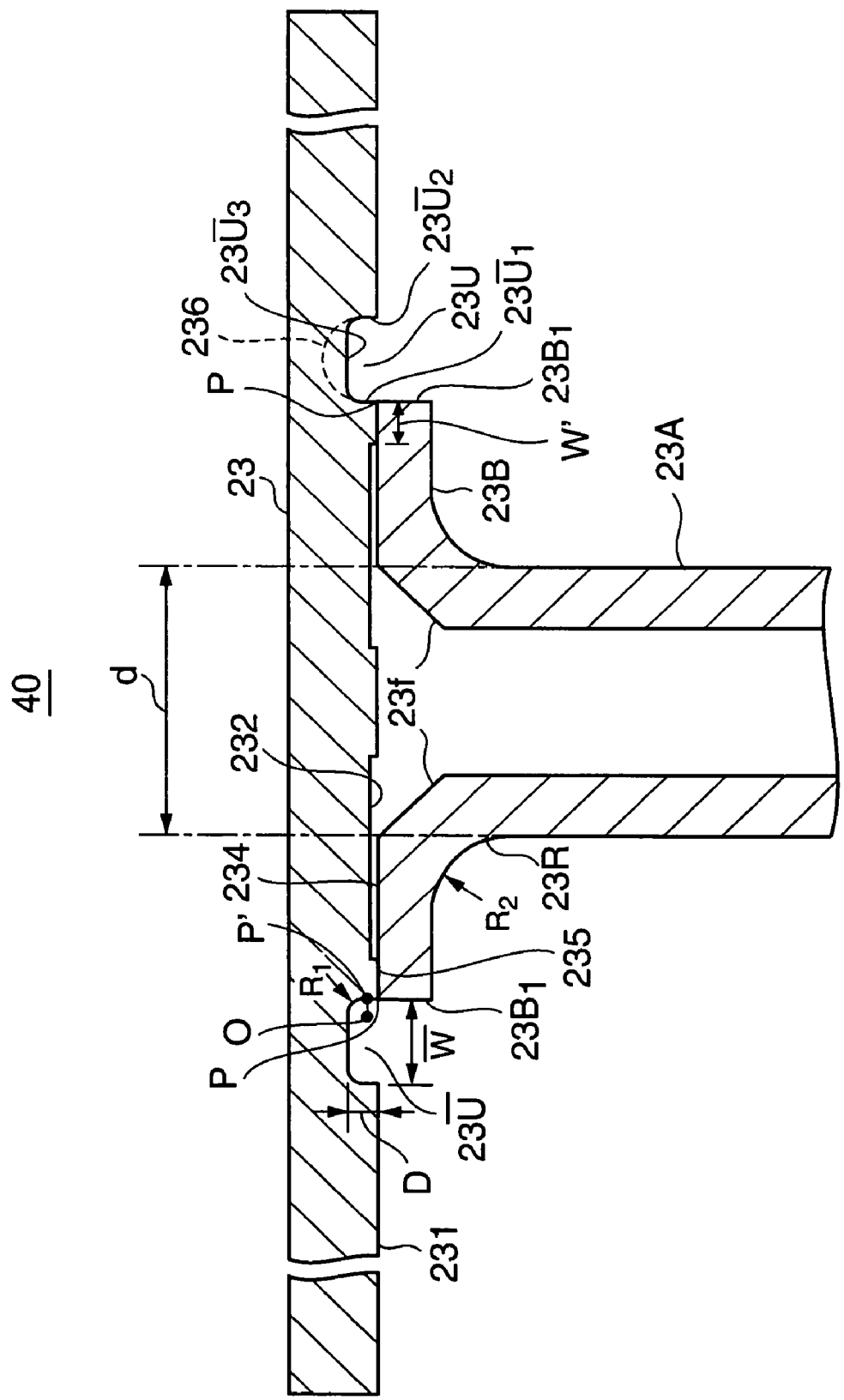
FIG. 7 is a vertical cross-sectional view showing the stress concentration reducing constitution employed in the substrate holding structure of FIG. 4.

FIG. 7 shows a structure for reducing thermal stress, which is employed in the substrate holding table 23 of FIG. 3. Referring to FIG. 7, the support column 23A for supporting the substrate holding table 23 includes a flanged part 23B provided at the top end of the support column 23A and a cylindrical main body having outer diameter d arranged below the flanged part 23B. Each of the substrate holding table 23 and the support column 23A is substantially a "body of rotation (a body obtained by rotating a plane about an axis)" in geometrical terminology.

Formed in a lower surface 231 of the substrate holding table 23 is an annular groove 23U having a U-shaped cross section (referred to as "U-shaped groove 23U" hereinafter). The U-shaped groove 23U is defined by an inner circumferential surface $23U_1$, an outer circumferential surface $23U_2$, and a bottom surface $23U_3$ connecting the inner circumferential surface $23U_1$ and the outer circumferential surface $23U_2$. The inner circumferential surface $23U_1$ is smoothly connected to the bottom surface $23U_3$ through a curved surface having a curvature radius $R_1$. The outer circumferential surface $23U_2$ is smoothly connected to the bottom surface $23U_3$ through a curved surface having the same curvature radius $R_1$. The curvature radius $R_1$ is smaller than depth D of the U-shaped groove 23U. A profile line of an outer circumferential surface $23B_1$ of the flanged part 23B extends in a vertical direction. A profile line of the inner circumferential surface $23U_1$ of the U-shaped groove 23U extends on an extension of the profile line of the outer circumferential surface $23B_1$ in the vertical direction. That is, the profile line of the outer circumferential surface 23B1 and the profile line of the inner circumferential surface $23U_1$ form a single, continuous, straight line (line segment) extending in the vertical direction, so that no step exists at a connecting point P between the profile lines. That is, the outer circumferential surface $23B_1$ and the inner circumferential surface $23U_1$ form a singe, continuous, curved surface having a cylindrical shape in the vicinity of a joint surface 235 (connecting point P) between the substrate holding table 23 and the support column 23A. The profile line of the curved surface having the curvature radius $R_1$ is in a form of an arc, which arc starts from a point P', which is located a predetermined distance upwardly apart from the connecting point P, and which arc centers on a point O in level with the point P' and has a center angle of 90 degrees. According to this constitution, a region where the maximum thermal stress is induced is located at a region corresponding to the curved surface having the curvature radius $R_1$. In other words, the region where the maximum thermal stress is induced is located at a region other than the joint surface 235 (connecting point P) between the substrate holding table 23 and the support column 23A having a low material strength.

If this substrate holding structure 50 is intended to be used for a 300 mm diameter wafer, respective dimensions of the structure are, for example, as follows: about 340 mm in diameter of the substrate holding table 23; 19 mm in thickness of the table 23; about 56 mm in diameter d of the main body of the support column 223A; about 86 mm in diameter of the outer circumferential surface $23B_1$ of the flanged part 23B of the support column 223A; about 5 mm in width W of the U-shaped groove 23U; about 2.5 mm in depth D of the U-shaped groove 23U; and about 2.5 mm in curvature radius $R_1$. It will be understood from the above that the amount of grinding for forming the U-shaped groove 23U is remarkably small. As the substrate holding table 23 is made of a ceramic material difficult to grind, the reduced grinding amount results in a greatly reduced manufacturing cost of the substrate holding table 23 and thus the substrate holding structure 50

Note that preferable dimensions of respective parts of the substrate holding table 23 are as follows:

Distance from point P to point P': 0.1-0.5 mm, more preferably, 0.5-1 mm;

Curvature radius $R_1$: 0.5-5 mm, more preferably, 1-3 mm;

Width W of U-shaped groove 23U: 1-20 mm, more preferably, 5-10 mm; and

Depth D of U-shaped groove 23U: 1-10 mm, more preferably, 1-5 mm.

Although the U-shaped groove 23U in the embodiment of FIG. 7 has the bottom surface $23U_3$ extending horizontally, the present invention is not limited thereto. As shown by broken lines on the right side of FIG. 7, an inner circumferential surface $23U_1$ may be connected to the outer circumferential surface $23U_2$ through a surface 236 having a single curvature radius.

An annular groove 232 is formed in the lower surface 231 of the substrate holding table 23. The depth of the groove 232 need not be so large, and may be about 1 mm. Due to the provision of the groove 232, a gap is defined between an upper surface 234 of the flanged part 23B of the support column 23A and the substrate holding table 23, so that the area of the joint surface 235 between the substrate holding table 23 and the support column 23A is reduced. As a large temperature difference exists between the substrate holding table 23 with a built-in heating mechanism and the support column 23A without including any heating mechanism, if the area of the joint surface 235 is too large, thermal stress induced in the vicinity of the joint surface 235 becomes larger. In addition, if the area of the joint surface 235 is too large, the calorific value flowing from the substrate holding table 23 to the support column 23A becomes large, deteriorating the temperature uniformity of the substrate holding table 23. In order to avoid such problems, the width of the joint surface 235 is set to be a value (e.g., 4 mm) as small as possible, as long as sufficient joint strength between the substrate holding table 23 and the support column 23A can be ensured. Note that the U-shaped groove 23U and the annular groove 232 are formed by grinding the flat lower surface 231 of the substrate holding table 23 arranged in a single horizontal plane. The joint surface 235 is positioned outside a cylinder which is coaxial with the support column 23A and has a diameter equal to the diameter d of the support column 23A.

An inner circumference of the flanged part 23B is in a form of an inclined surface 23f, whereby thermal stress concentration thereto is reduced. A curved surface 23R having a curvature radius $R_2$ is formed at a transitional part, from the main body to the flanged part 23B, of the support column 23A, whereby thermal stress concentration thereto is reduced.

Figure 8:
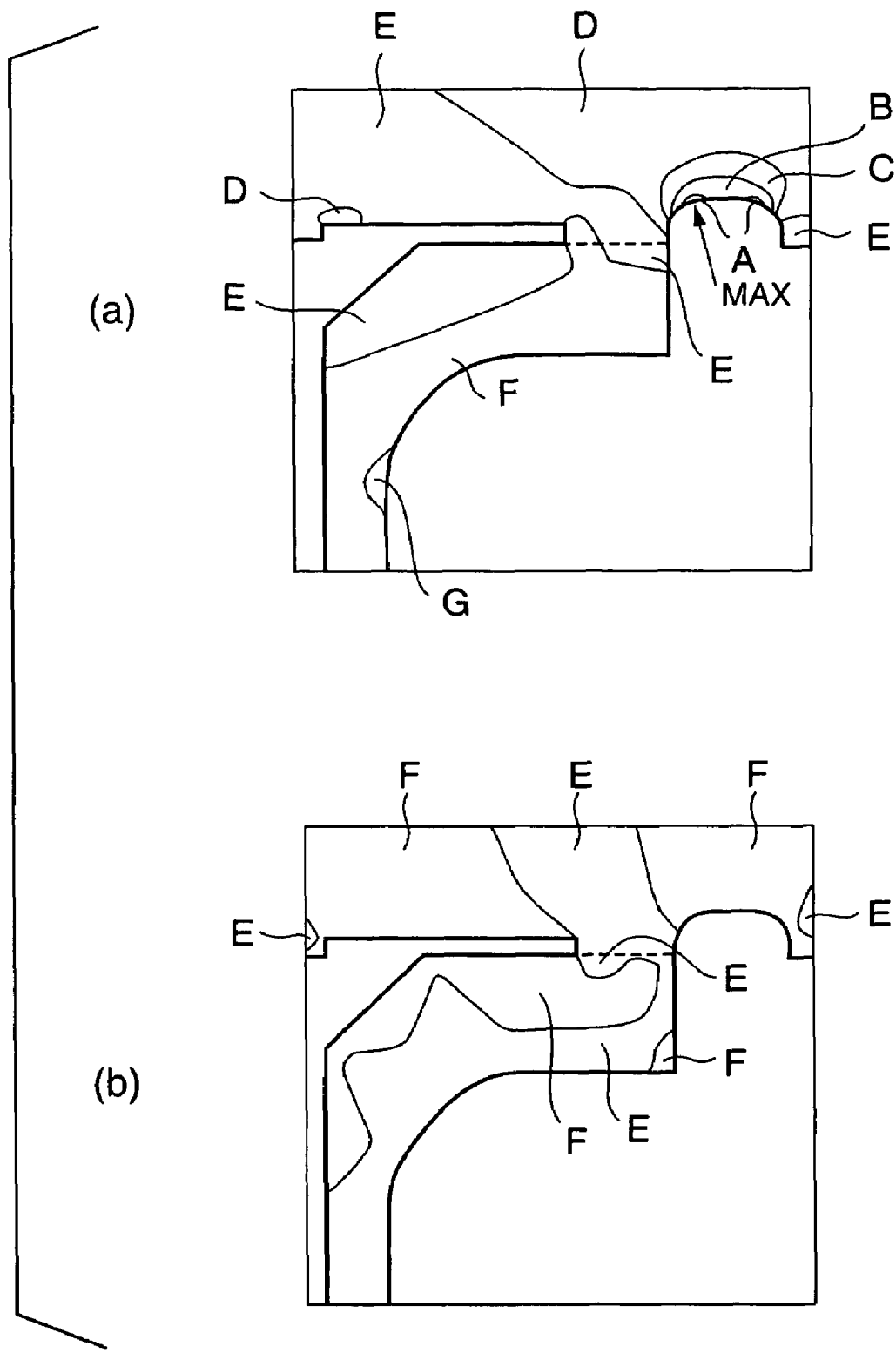
FIGS. 8(A) and (B) are charts showing distribution of thermal stress induced in the substrate holding structure of FIG. 7 under a center-cool condition and a center hot condition, respectively.

FIG. 8(A) shows stress distribution in the substrate holding structure of FIG. 7 when the substrate holding structure 23 shows so-called "center-cool" temperature gradient, where the temperature of the center part is low while the temperature of the peripheral part is high. Alphabets attached to respective areas denote various levels of stress: "A" designates an area with a stress exceeding +6.79 kgf·mm$^{-2}$; "B" designates an area with a stress of 5.43~+6.79 kgf·mm$^{-2}$; "C" designates an area with a stress of +4.07~+5.43 kgf·mm$^{-2}$; "D" designates an area with a stress of +2.71~+4.07 kgf·mm$^{-2}$; "E" designates an area with a stress of +1.35~+2.71 kgf·mm$^{-2}$; "F" designates an area with a stress of 0~+1.35 kgf·mm$^{-2}$; and "G" designates an area with a stress of −1.37~0 kgf·mm$^{-2}$. Note that a positive value represents a tensile stress, while a negative value represents a compressive stress.

Referring to FIG. 8(A), as the center part of the substrate holding table 23 is contracted in comparison with the peripheral part under such a "center-cool" condition, a large tensile stress tends to be induced in the table 23, particularly, at a position thereof corresponding to the outer circumferential surface $23B_1$ of the flanged part 23B. However, it is found that the stress concentration is remarkably reduced due to the provision of the U-shaped groove 23U at a position corresponding to the outer circumferential surface $23B_1$. In the state shown in FIG. 8(A), it will be understood that the maximum tensile stress (the value exceeding 8.15 kgf·mm$^{-2}$) appears in the curved surface part having curvature radius R1 in the U-shaped groove 23U (see an arrow labeled "MAX"). It should especially be noted that the stress concentration does not appear in the joint between the substrate holding table 23 and the support column 23A.

FIG. 8(B) shows stress distribution under so-called "center-hot" condition, where the temperature of the center part of substrate holding table 23B is high while the temperature of the peripheral part is low. In this case, it is found that little thermal stress concentration appears in the vicinity of the joint between the substrate holding table 23 and the support column 23A.

Figure 1:
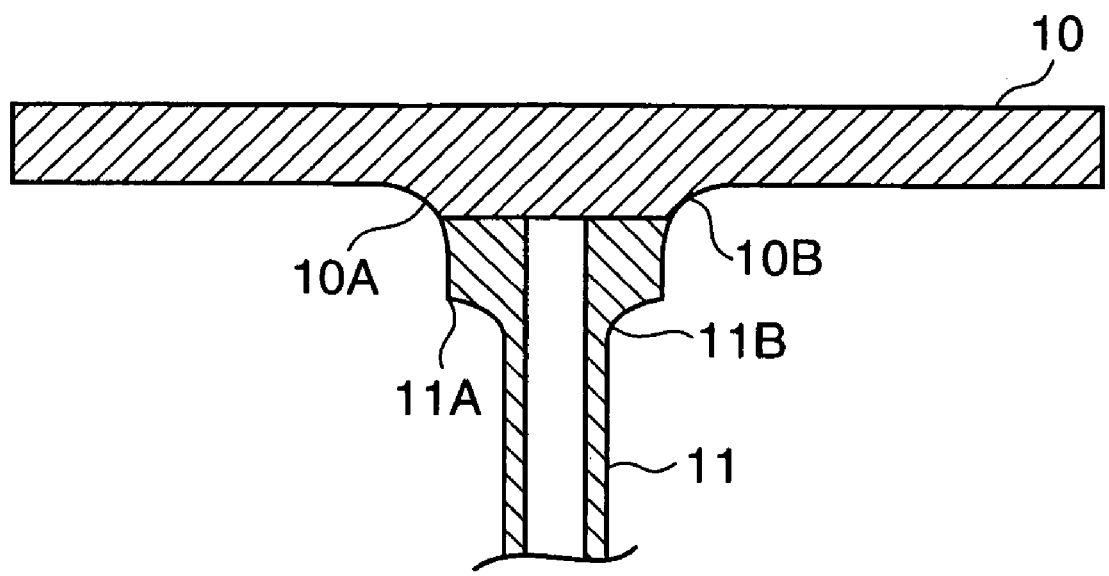
FIG. 1 is a vertical cross-sectional view showing the constitution of a conventional substrate holding structure.
Figure 2:
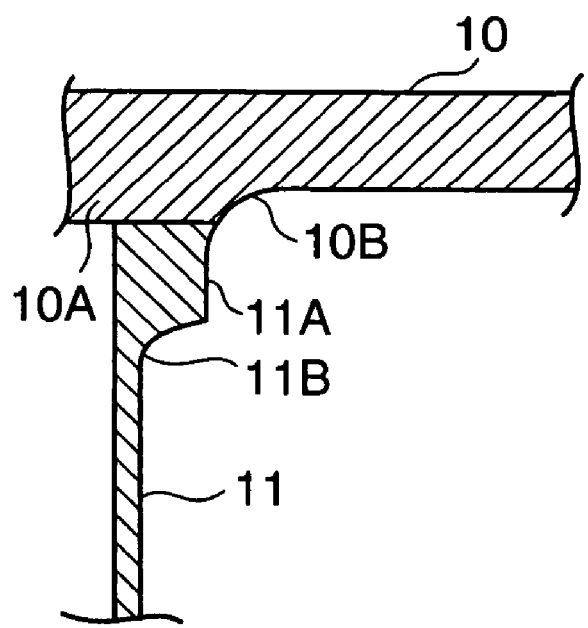
FIG. 2 is an enlarged, vertical cross-sectional view showing a part of the substrate holding structure of FIG. 1.

As mentioned above, with the substrate holding structure in this embodiment, the thermal stress concentration can be reduced while minimizing a grinding amount of the lower surface of the substrate holding table (see and compare with the prior art of FIGS. 1 and 2). In addition, as the heaters 24A and 24B are driven independently of each other, the temperature gradient in the substrate holding table 23 can be minimized. Consequently, it is possible to manufacture a substrate holding structure, which is reliable and has no risk of failure, at a low cost.

2nd. EMBODIMENT

Figure 9:
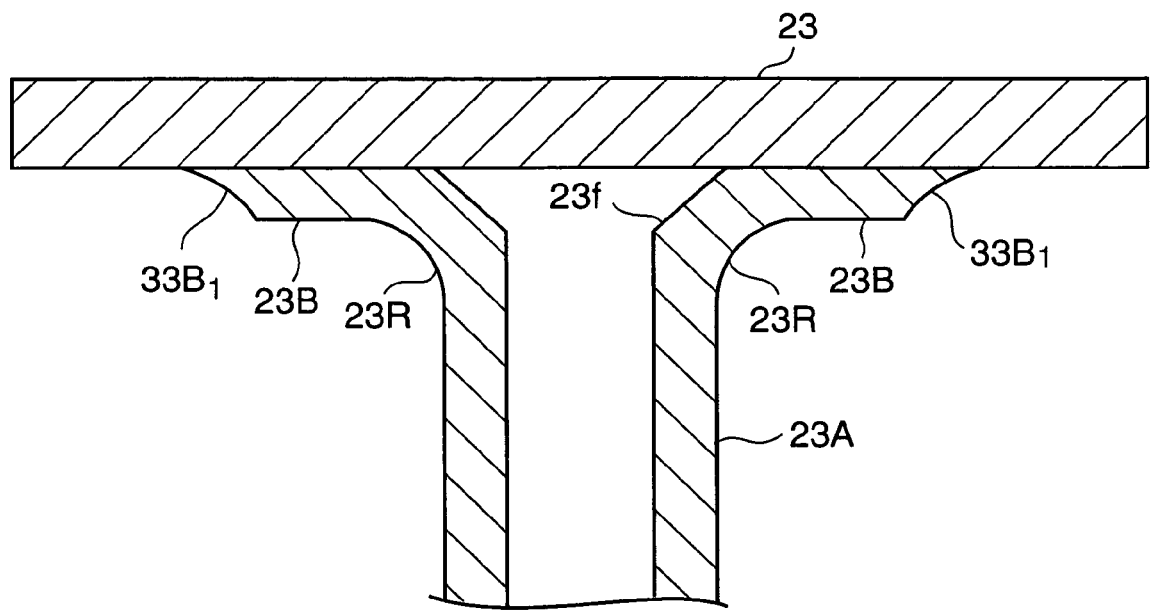
FIG. 9 is a vertical cross-sectional view showing the constitution of a substrate holding structure in a second embodiment of the present invention.

FIG. 9 shows a constitution of a substrate holding structure in the second embodiment of the present invention. In FIG. 9, component parts identical to those in the first embodiment are designated by the same reference signs, and duplicate description thereof are omitted.

Referring to FIG. 9, the substrate holding structure 40 of the second embodiment has a structure similar to the substrate holding structure 20 of the first embodiment, however, the former mainly differs from the latter in that an outer circumferential surface of the flanged part 23B of the support column 23A is in a form of an inclined surface $33B_1$ inclined such that the diameter of the outer circumferential surface gradually increases as approaching the lower surface of the substrate holding table 23.

A profile line of the inclined surface $33B_1$ is curved so that it undergoes continuous transition to the profile line of the lower surface of the substrate holding table 23. In other words, the inclination of a tangential line of the profile line with respect to a horizontal plane gradually becomes close to 0 degree as approaching the lower surface of the substrate holding table 23. Consequently, there exists no step which causes stress concentration at a part between the outer circumferential surface $33B_1$ and the lower surface of the substrate holding table 23.

According to this embodiment, as it is unnecessary to grind the lower surface of the substrate holding table 23, the manufacturing cost of the substrate holding structure is further reduced.

Also in this embodiment, by driving the heaters 24A and 24B independently of each other, it is possible to minimize the temperature gradient in the substrate holding table 23, and thus generation of thermal stress itself can be restrained.

In the above description, the substrate holding structure 20 or 40 is used in the CVD apparatus of FIG. 3. However, the invention is not limited to thereto, and the same structure is generally applicable to various substrate processing apparatuses, for example, a plasma-assisted CVD apparatus, a heat treatment (RTP) apparatus, an etching apparatus, and so on.

The description has been made for preferred embodiments of the present invention. However, the invention is not limited to the above-mentioned embodiments, and various changes and modifications are possible within the scope of claims.

The invention claimed is:

1. A substrate holding structure comprising:
   a support column including a main body having an outer diameter, d, a top end portion with a flanged part, and an outer curvilinear transition part from the support column to the flanged part,
   a substrate holding table joined to the flanged part at an annular joint surface between the table and the flanged part; and
   a heating mechanism in the substrate holding table;
   the substrate holding table having a lower surface with an annular U-shaped groove extending along an outer circumferential surface of the flanged part, an inner circumferential surface of the U-shaped groove being connected to the outer circumferential surface of the flanged part to form a continuous smooth outermost surface surrounding the joint surface; and the lower surface of the substrate holding table having a second annular groove opposing the flanged part, whereby the flanged part is joined to the lower surface of the substrate holding table to provide the annular joint surface at only an outermost annular area of an upper surface of the flanged part, the second groove extending radially outwardly from a projection of outer diameter, d, through the flanged part, to the annular joint surface, whereby the second groove forms a space that separates a substantial portion of the upper surface of the flanged part from the substrate holding table.

2. The substrate holding structure according to claim 1, wherein in sectional view, both an end portion of a profile line of the inner circumferential surface of the U-shaped groove on a side of the flanged part and a profile line of the outer circumferential surface of the flanged part are situated on a single line segment extending in a vertical direction.

3. The substrate holding structure according to claim 2, wherein: the substrate holding structure is made by joining the flanged part and the substrate holding table to each other after forming them individually; and a joint surface between the flanged part and the substrate holding table is positioned so as to be connected to the single line segment extending in the vertical direction.

4. The substrate holding structure according to claim 1, wherein an inner circumferential surface of the flanged part provides an inclined surface, which is inclined such that an inner diameter of the flanged part successively increases as approaching the lower surface of the substrate holding table.

5. The substrate holding structure according to claim 1, wherein: the heating mechanism includes an inner heating-mechanism part and an outer heating-mechanism part formed outside the inner heating-mechanism part; and the inner heating-mechanism part and the outer heating-mechanism part are driven by first and second drive power supply system both extending in the support column, respectively.

6. The substrate holding structure according to claim 5, wherein: the substrate holding table includes first and second semicircular conductive patterns, which are arranged below the heating mechanism and are connected to the second power supply line constituting the second drive power supply system; and the first and second conductive patterns substantially cover a whole area of the substrate holding table except for gap areas defined between the first conductive pattern and the second conductive pattern.

7. The substrate holding structure according to claim 1, wherein the substrate holding table and the support column are made of ceramics.

8. A substrate processing apparatus comprising: a processing vessel connected to an exhaust system; a gas supply system that supplies a process gas into the processing vessel; and the substrate holding structure, as defined in claim 1, arranged in the processing vessel.

9. A substrate processing apparatus comprising: a processing vessel connected to an exhaust system; a gas supply system that supplies a process gas into the processing vessel; and the substrate holding structure, as defined in claim 1, arranged in the processing vessel.

* * * * *